US012210292B2

(12) United States Patent
Utsunomiya

(10) Patent No.: US 12,210,292 B2
(45) Date of Patent: Jan. 28, 2025

(54) TREATMENT SOLUTION SUPPLY APPARATUS, REPORTING METHOD, AND STORAGE MEDIUM

(71) Applicant: Tokyo Electron Limited, Tokyo (JP)

(72) Inventor: Yoshinori Utsunomiya, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 671 days.

(21) Appl. No.: 17/496,357

(22) Filed: Oct. 7, 2021

(65) Prior Publication Data

US 2022/0121126 A1 Apr. 21, 2022

(30) Foreign Application Priority Data

Oct. 15, 2020 (JP) .................................. 2020-174018

(51) Int. Cl.
*G06F 7/00* (2006.01)
*G03F 7/00* (2006.01)
*G06Q 10/08* (2023.01)

(52) U.S. Cl.
CPC .......... *G03F 7/70525* (2013.01); *G06Q 10/08* (2013.01)

(58) Field of Classification Search
CPC ...... G03F 7/70525; G03F 7/0012; G03F 7/30; G03F 7/16; G06Q 10/08; H01L 21/6715; H01L 21/67259; H01L 21/67294; H01L 21/67178; H01L 21/67017; H01L 21/67769
See application file for complete search history.

(56) References Cited

U.S. PATENT DOCUMENTS

| | | | | |
|---|---|---|---|---|
| 7,665,415 B2 * | 2/2010 | Nishimura | ........ | H01L 21/67294 118/712 |
| 7,702,418 B2 * | 4/2010 | O'Dougherty | ....... | B67D 7/0283 73/866.5 |
| 8,539,800 B2 * | 9/2013 | Chen | ...................... | G01F 11/284 141/98 |
| 10,857,676 B2 * | 12/2020 | Yu | .......................... | B25J 13/006 |

(Continued)

FOREIGN PATENT DOCUMENTS

| | | | |
|---|---|---|---|
| JP | 2001217217 A | * | 8/2001 |
| JP | 2006-218391 A | | 8/2006 |

(Continued)

*Primary Examiner* — Yongjia Pan
(74) *Attorney, Agent, or Firm* — Posz Law Group, PLC

(57) ABSTRACT

A treatment solution supply apparatus supplies a treatment solution to a substrate treatment apparatus which treats a substrate using the treatment solution. The treatment solution supply apparatus includes an accommodating part having compartments; in each compartment a storage container storing the treatment solution is installed from one side surface side. An acquirer provided for each of the compartments acquires identification information about the storage container from an identification information holder attached to a side surface of the storage container installed in the compartment corresponding thereto. A report part provided for each of the compartments reports an installation state of the storage container in the compartment based on an acquisition result by the acquirer for the corresponding compartment, by a light emitting state of a light-emitting element, the light-emitting element of the report part emitting light toward the one side surface side.

12 Claims, 11 Drawing Sheets

(56) References Cited

U.S. PATENT DOCUMENTS

| | | | |
|---|---|---|---|
| 11,029,603 B2* | 6/2021 | Chen | B25J 9/1679 |
| 2004/0172160 A1* | 9/2004 | O'Dougherty | H01L 21/67294 |
| | | | 700/231 |
| 2010/0146587 A1* | 6/2010 | Sholes | B67D 7/348 |
| | | | 726/2 |
| 2010/0290872 A1* | 11/2010 | Bonora | H01L 21/67769 |
| | | | 257/E21.001 |
| 2013/0062404 A1* | 3/2013 | Devergne | G06F 17/00 |
| | | | 235/375 |
| 2020/0103756 A1* | 4/2020 | Chen | H01L 21/67294 |
| 2020/0381107 A1* | 12/2020 | Lowry | G08B 5/36 |

FOREIGN PATENT DOCUMENTS

| | | | |
|---|---|---|---|
| JP | 2009290106 A | * | 12/2009 |
| KR | 20130049491 A | * | 5/2013 |
| KR | 20140023430 A | * | 2/2014 |

* cited by examiner

TREATMENT SOLUTION SUPPLY APPARATUS, REPORTING METHOD, AND STORAGE MEDIUM

CROSS REFERENCE TO RELATED APPLICATIONS

This application is based upon and claims the benefit of priority of the prior Japanese Patent Application No. 2020-174018, filed in Japan on Oct. 15, 2020, the entire contents of which are incorporated herein by reference.

TECHNICAL FIELD

This disclosure relates to a treatment solution supply apparatus, a reporting method, and a storage medium.

BACKGROUND

Japanese Laid-open Patent Publication No. 2006-218391 discloses a method of replacing a chemical accommodating container. In this method, an LED display part in which LEDs are arranged to have almost the same arrangement form as that of containers is used, and a corresponding LED in the LED display part lights up when the container becomes empty of the chemical. An operator reads a bar code on an unused container by using a bar code reader prior to an operation of replacing a container 71. A bar code reader collator collates bar code data about the unused container with bar code data about a container corresponding to the lighting-up LED registered in a database. When the bar code reader collator determines that the kinds of the chemicals in both containers are the same, the display of the LED is shifted from the lighting-up display to a blinking display.

SUMMARY

An aspect of this disclosure is a treatment solution supply apparatus for supplying a treatment solution to a substrate treatment apparatus which treats a substrate using the treatment solution, the treatment solution supply apparatus including: an accommodating part having a plurality of compartments in each of which a storage container storing the treatment solution is installed from one side surface side; an acquirer provided for each of the compartments and configured to acquire identification information about the storage container from an identification information holder attached to a side surface of the storage container installed in the compartment corresponding thereto; and a report part provided for each of the compartments and configured to report an installation state of the storage container in the compartment based on an acquisition result by the acquirer for the corresponding compartment, by a light emitting state of a light-emitting element, the light-emitting element of the report part emitting light toward the one side surface side.

DETAILED DESCRIPTION OF THE INVENTION

Figure 1:
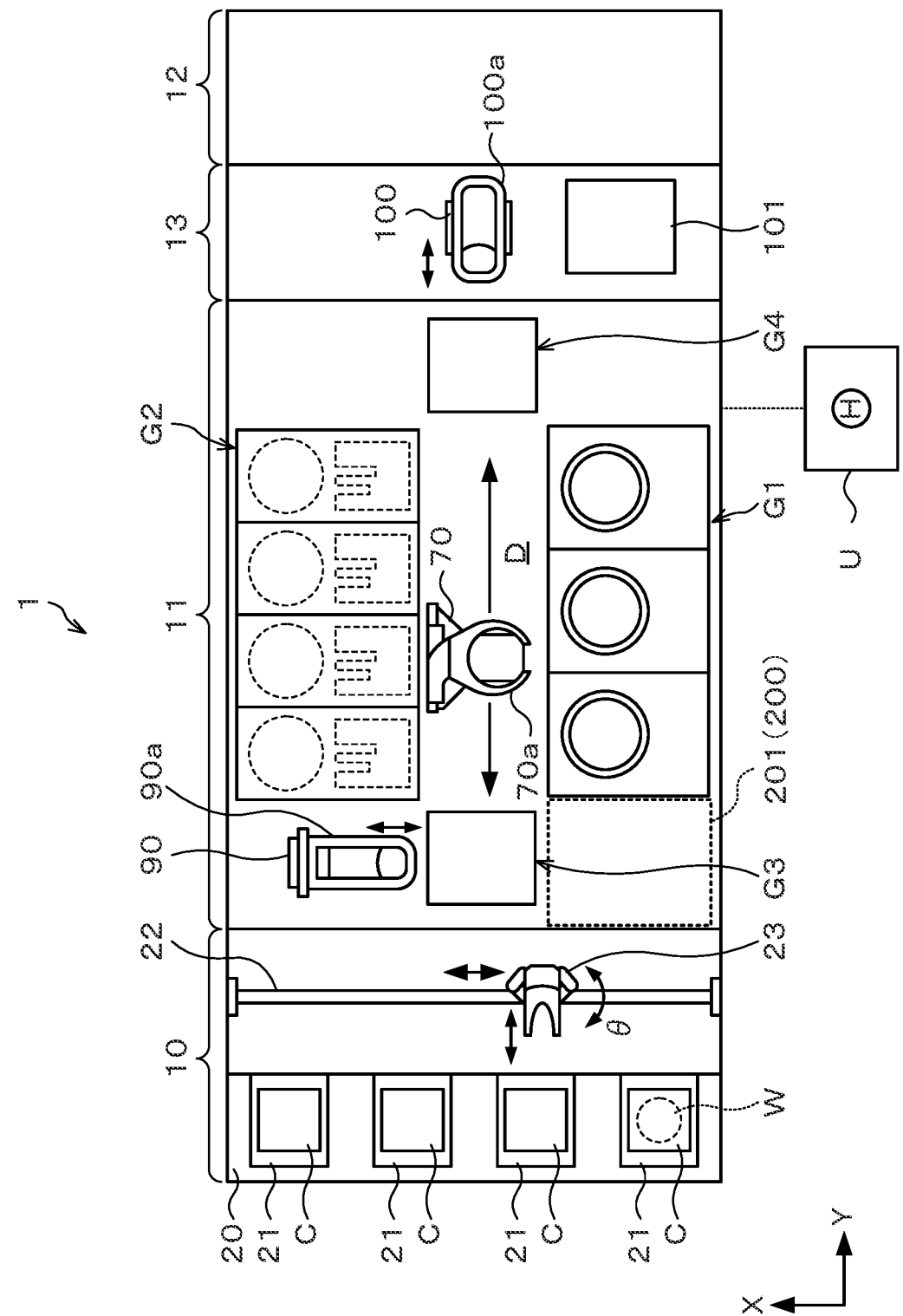
FIG. 1 is an explanatory view illustrating the outline of an internal configuration of a wafer treatment system including a treatment solution supply apparatus according to an embodiment.

In a manufacturing process of, for example, a semiconductor device, in order to form a resist pattern on a semiconductor wafer (hereinafter, referred to as a "wafer"), various solution treatments such as a treatment of applying a resist solution onto the wafer to form a resist film, a treatment of supplying a developing solution onto the wafer to perform a developing treatment on the resist film and so on are performed. These solution treatments are performed by a substrate treatment system equipped with various solution treatment apparatuses, a transfer mechanism for transferring the wafer between the apparatuses and so on.

In the substrate treatment system, various treatment solutions are supplied from storage containers storing the treatment solutions to the various solution treatment apparatuses. Further, for the treatment solutions, for example, a plurality of kinds of treatment solutions such as the resist solution and the developing solution are used, and various kinds are used for the resist solution and so on themselves. Therefore, many storage containers for the treatment solutions are arranged in the substrate treatment system.

One of methods of replacing the storage containers for the treatment solutions in a state in which many storage containers are arranged is the method disclosed in the aforementioned Japanese Laid.-open Patent Publication No. 2006-218391. However, by the method disclosed in the Japanese Laid-open Patent Publication No. 2006-218391, when the operator installs an unused storage container whose bar code is read by a bar code reader in a wrong place by mistake, the operator cannot know the fact, so that the wrong treatment solution is supplied in some cases.

Further, it is preferable that the operator can immediately (namely, in situ) recognize that the unused storage container is installed in the wrong place as explained above. This is because the replacement work time is made shorter as much as possible.

Hence, the technique according to this disclosure reports the propriety of the storage container after replacement so that the operator during the replacement work can immediately visually recognize the propriety at the time of replacement of the storage container for the treatment solution.

Hereinafter, a treatment solution supply apparatus and a reporting method according to embodiments will be explained referring to the drawings. Note that the same codes are given to components having substantially the same functional configurations in the description to omit duplicated explanation.

<Wafer Treatment System>

Figure 2:
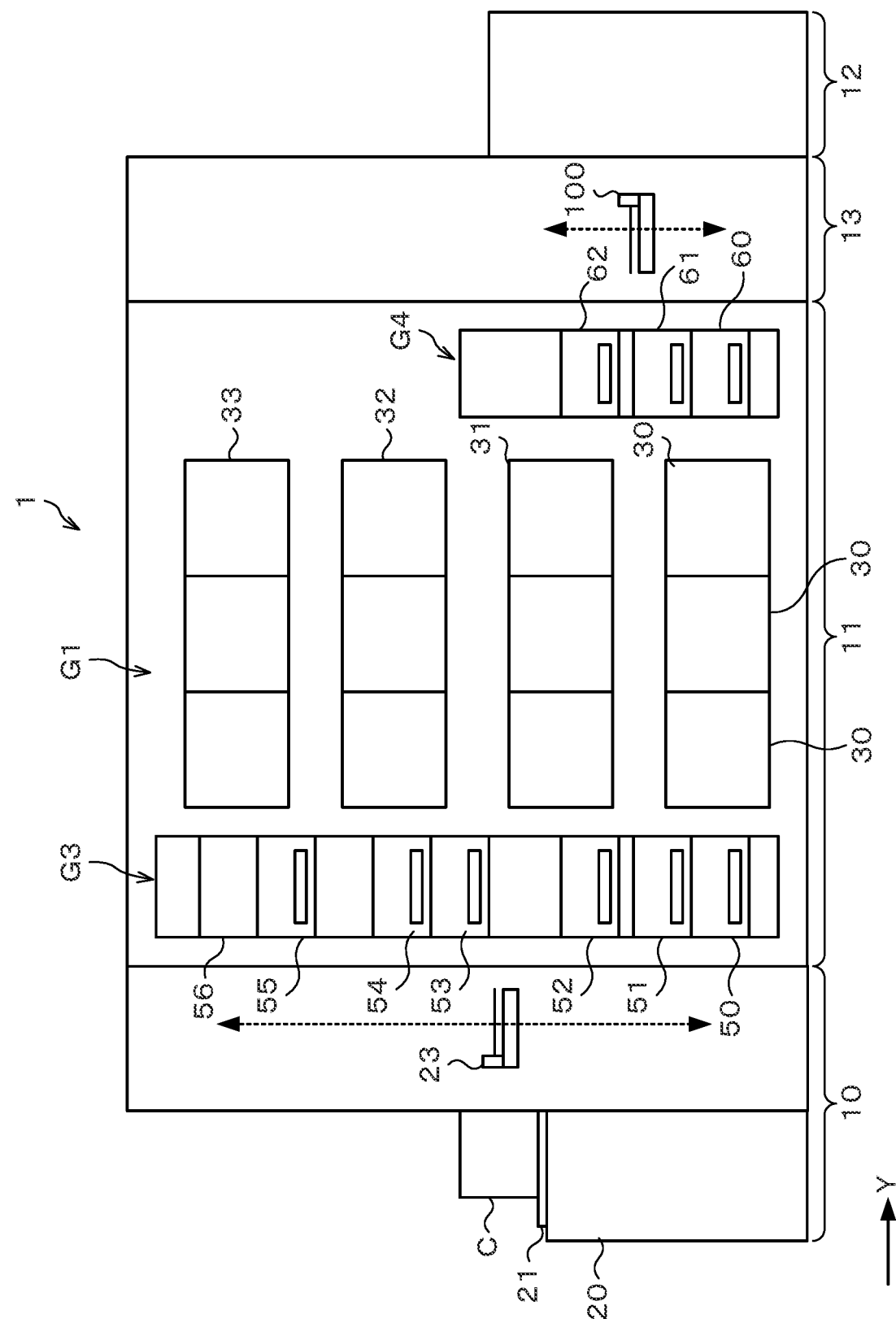
FIG. 2 is a view schematically illustrating the outline of the internal configuration on the front side of the wafer treatment system.
Figure 3:
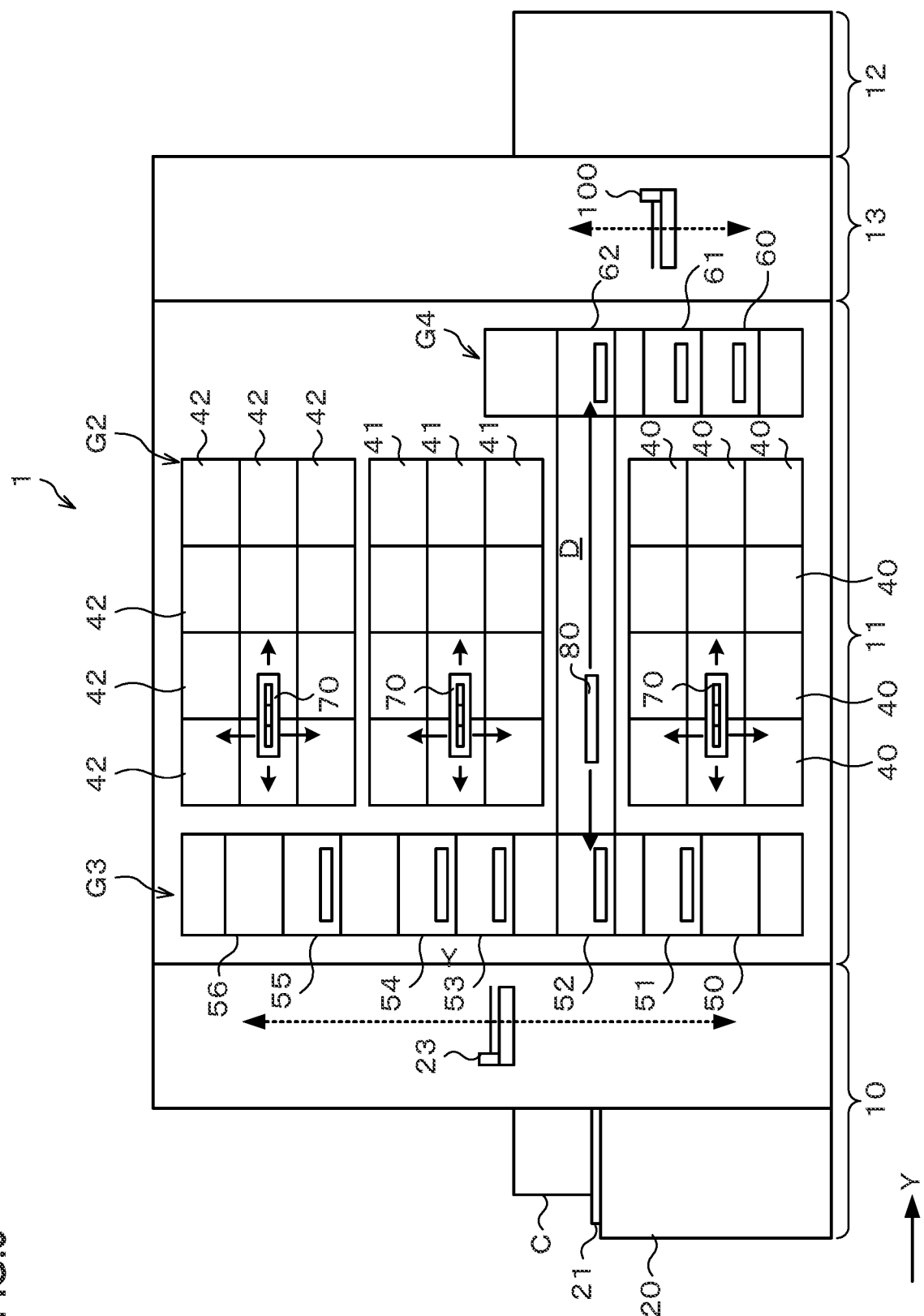
FIG. 3 is a view schematically illustrating the outline of the internal configuration on the rear side of the wafer treatment system.
Figure 4:
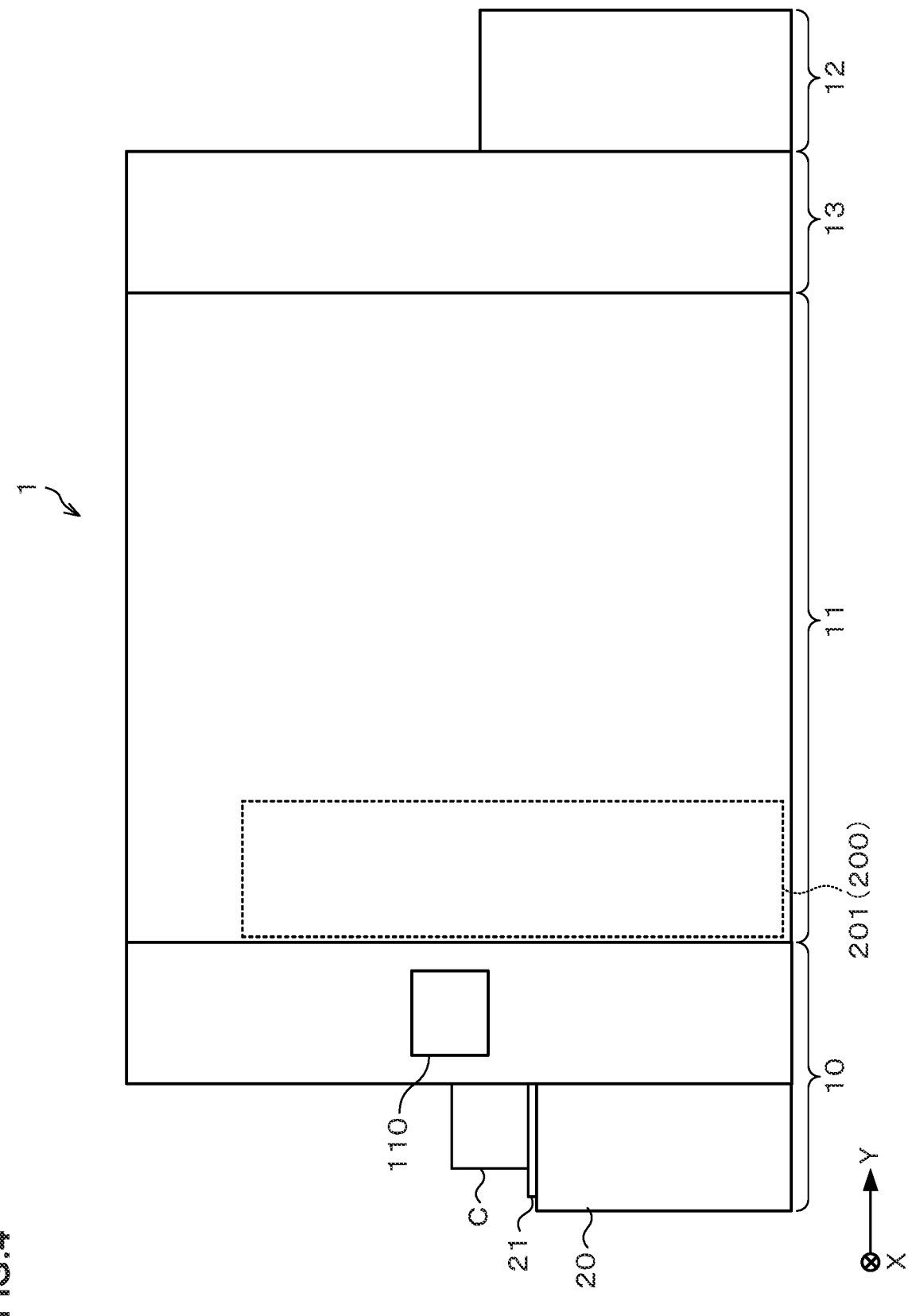
FIG. 4 is a front view illustrating the outline of an external appearance of the wafer treatment system.
Figure 5:
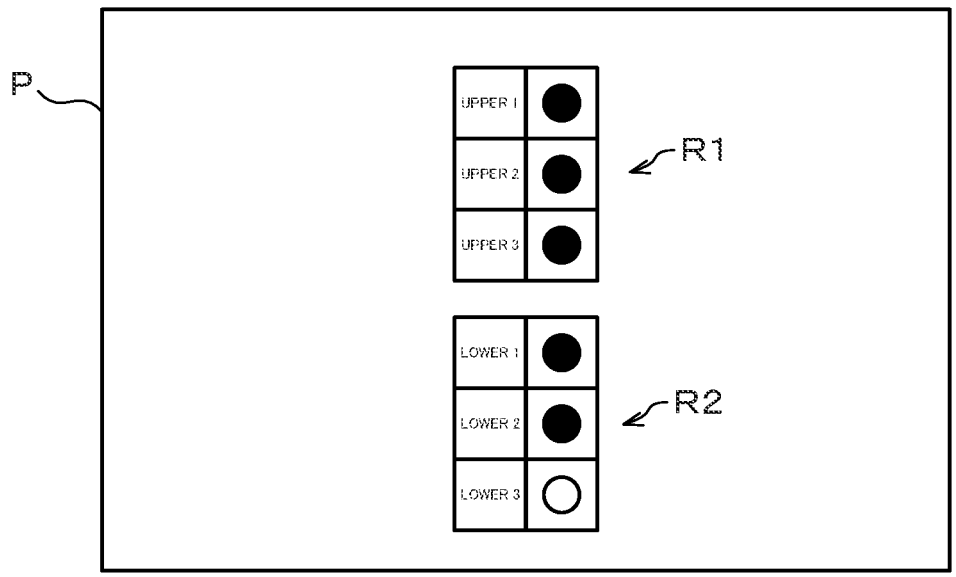
FIG. 5 is a view illustrating an example of a display screen displayed on a touch panel.
Figure 6:
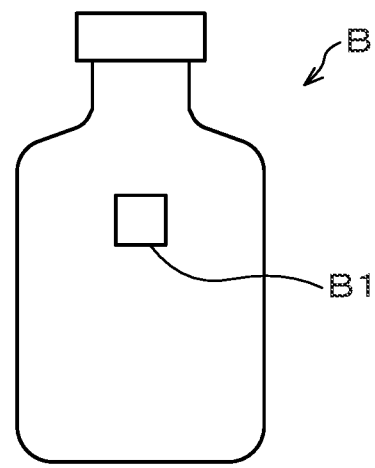
FIG. 6 is a perspective view illustrating the outline of a configuration of a storage container for the treatment solution.

FIG. 1 is an explanatory view illustrating the outline of an internal configuration of a wafer treatment system 1 including a treatment solution supply apparatus according to an embodiment. FIG. 2 and FIG. 3 are views schematically illustrating the outline of the internal configuration on the front side and the rear side of the wafer treatment system 1, respectively. FIG. 4 is a front view illustrating the outline of an external appearance of the wafer treatment system 1. FIG. 5 is a view illustrating an example of a display screen displayed by a later-explained touch panel. FIG. 6 is a perspective view illustrating the outline of a configuration of a storage container for the treatment solution. Note that the wafer treatment system 1 is a coating and developing treatment system which performs a coating and developing treatment on the wafer W in the following example.

The wafer treatment system 1 has, as illustrated in FIG. 1, a cassette station 10 into/out of which a cassette C housing a plurality of wafers W is transferred, and a treatment station 11 including a plurality of various treatment apparatuses which perform predetermined treatments on the wafer W. The wafer treatment system 1 has a configuration in which the cassette station 10, the treatment station 11, and an interface station 13 which performs delivery of the wafer W to/from an exposure apparatus 12 adjacent to the treatment station 11 are integrally connected.

In the cassette station 10, a cassette stage 20 is provided. On the cassette stage 20, a plurality of cassette stage plates 21 are provided on which the cassettes C are mounted when the cassettes C are transferred in/out from/to the outside of the substrate treatment system 1.

In the cassette station 10, a wafer transfer apparatus 23 is provided which is movable on a transfer path 22 extending in an X-direction. The wafer transfer apparatus 23 is movable also in an up-down direction and around a vertical axis (in a θ-direction), and can transfer the wafer W between the cassette C on each of the cassette stage plates 21 and a later-explained delivery apparatus in a third block G3 in the treatment station 11.

In the treatment station 11, a plurality of, for example, four blocks G1, G2, G3, G4 each including various apparatuses are provided. For example, the first block G1 is provided on the front side (X-direction negative direction side in FIG. 1) in the treatment station 11, and the second block G2 is provided on the rear side (X-direction positive direction side in FIG. 1) in the treatment station 11. Further, the third block G3 is provided on the cassette station 10 side (Y-direction negative direction side in FIG. 1) in the treatment station I 1, and the fourth block G4 is provided on the interface station 13 side (Y-direction positive direction side in FIG. 1) in the treatment station 11.

In the first block G1, as illustrated in FIG. 2, a plurality of solution treatment apparatuses, for example, developing treatment apparatuses 30, lower ant reflection film forming apparatuses 31, resist coating apparatuses 32, and upper anti-reflection film forming apparatuses 33 are arranged in this order from the bottom. The developing treatment apparatus 30 is intended to perform a developing treatment on the wafer W, and the lower anti-reflection film forming apparatus 31 is intended to form an anti-reflection film (hereinafter, referred to as a "lower anti-reflection film") at a lower layer of a resist film of the wafer W. The resist coating apparatus 32 is intended to apply a resist solution to the wafer W to form a resist film, and the upper anti-reflection film forming apparatus 33 is intended to form an anti-reflection film (hereinafter, referred to as an "upper anti-reflection film") at an upper layer of the resist film of the wafer W.

The solution treatment apparatus 30, the lower anti-reflection film forming apparatus 31, the resist coating apparatus 3 and the upper anti-reflection film forming apparatus 33 are provided, for example, three each arranged side by side in a horizontal direction. Note that the numbers and the arrangement of the solution treatment apparatuses 30, the lower anti-reflection film forming apparatuses 31, the resist coating apparatuses 32, and the upper anti-reflection film forming apparatuses 33 can also be arbitrarily selected.

In each of the solution treatment apparatus 30, the lower anti-reflection film forming apparatus 31, the resist coating apparatus 32, and the upper anti-reflection film forming apparatus 33, a predetermined solution is supplied onto the wafer W, for example, by the spin coating method. In the spin coating method, the treatment solution is discharged onto the wafer W, for example, from a discharge nozzle and the wafer W is rotated to diffuse the treatment solution over the surface of the wafer W.

In the second block G2, as illustrated in FIG. 3, thermal treatment apparatuses 40 each of which performs a thermal treatment such as heating and cooling on the wafer W, adhesion apparatuses 41 each of which enhances the fixation between the resist solution and the wafer W and edge exposure apparatuses 42 each of which exposes the outer peripheral portion of the wafer W, are provided. The thermal treatment apparatuses 40, the adhesion apparatuses 41, and the edge exposure apparatuses 42 are provided one above the other in the up-down direction and side by side in the horizontal direction, and the numbers and the arrangement of the apparatuses can be arbitrarily selected.

In the third block G3, for example, a plurality of delivery apparatuses 50, 51, 52, 53, 54, 55 are provided in order from the bottom. Further, in the fourth block G4, a plurality of delivery apparatuses 60, 61, 62 are provided in order from the bottom.

As illustrated in FIG. 1, in a region surrounded by the first block GI to the fourth block G4, a wafer transfer region D as a substrate transfer region is formed. In the wafer transfer region D, a wafer transfer apparatus 70 as a substrate transfer apparatus is arranged.

The wafer transfer apparatus 70 has a transfer area 70a movable, for example, in the Y-direction, the X-direction, the θ-direction, and the up-down direction. The wafer transfer apparatus 70 can move in the wafer transfer region D and transfer the wafer W to a predetermined apparatus in the first block G1, the second block G2, the third block G3, and the fourth block G4 thereabound. A plurality of the wafer transfer apparatuses 70 are arranged one above the other as illustrated in FIG. 3, each of which can transfer the wafer W, for example, to a predetermined apparatus at the same height in each of the blocks G1 to G4.

Further, in the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction in FIG. 3. The shuttle transfer apparatus 80 can move in the Y-direction while supporting the wafer W and transfer the wafer W between the delivery apparatus 52 in the third block G3 and the delivery apparatus 62 in the fourth block G4.

As illustrated in FIG. 1, a wafer transfer apparatus 90 is provided adjacent to the third block G3 on the X-direction positive direction side. The wafer transfer apparatus 90 has a transfer arm 90*a* that is movable, for example, in the X-direction, the θ-direction, and the up-down direction. The wafer transfer apparatus 90 can move up and down while supporting the wafer W to transfer the wafer W to each of the delivery apparatuses in the third block G3.

In the interface station 13, a wafer transfer apparatus 100 and a delivery apparatus 101 are provided. The wafer transfer apparatus 100 has a transfer arm 100*a* that is movable, for example, in the Y-direction, the θ-direction, and the up-down direction. The wafer transfer apparatus 100 can transfer the wafer W to/from each of the delivery apparatuses in the fourth block G4, the delivery apparatus 101 and the exposure apparatus 12, for example, while supporting the wafer W by the transfer arm 100*a*.

In the aforementioned cassette station 10, as illustrated in FIG. 4, a touch panel 110 is provided which functions also as a display apparatus displaying a screen indicating various kinds of information. The touch panel 110 has a display device composed of a liquid crystal panel, an organic EL panel or the like. Further, the touch panel 110 is provided on the treatment station 11 side in the cassette station 10, for example, in a manner that its display surface is directed to the front side (X-direction negative direction side in FIG. 4).

The display screen displayed on the touch panel 110 is, for example, as illustrated in FIG. 5, a display screen P having regions R1, R2 where whether a later-explained RFID tag is detected or not by a later-explained RFID reader is indicated by "●" or "○" for each RFID reader. For example, "●" indicates that the RFID tag is detected, whereas "○" indicates that the RFID tag is not detected. On the display screen P, the region R1 located on the upper side indicates information about RFID readers located at an upper part of a plurality of RFID readers. Further, on the display screen the region R2 located on the lower side indicates information about RFID readers located at a lower part of the plurality of RFID readers.

The touch panel 110 can display not only the display screen P in FIG. 5 but also a setting screen for making setting about the later-explained RFID tag, an error screen displaying information about an error occurring at present in the wafer treatment system 1, and so on.

Furthermore, in the treatment station 11, an accommodating apparatus 201 included in a treatment solution supply apparatus 200 is provided as illustrated in FIG. 1 and FIG. 4. The accommodating apparatus 201 is intended to accommodate a storage container B (see FIG. 6) for storing a treatment solution, and is provided, for example, at a position closer to a lower part on the cassette station 10 side in the treatment station 11 as illustrated in FIG. 1 and FIG. 4.

The accommodating apparatus 201 is configured to be movable along a rail (not illustrated) extending in a front-rear direction (X-direction in FIG. 1 and FIG. 4) and is thus movable along the front-rear direction. The accommodating apparatus 201 is housed in the treatment station 11 at normal times, and is drawn from the treatment station 11 to the near side at replacement of the storage container B, thereby enabling an operator to remove the storage container B from the accommodating apparatus 201 or install the storage container B in the accommodating apparatus 201.

The storage container B accommodated in the accommodating apparatus 201 stores, for example, a resist solution as the treatment solution. Further, an RFID tag B1 as an identification information holder is attached to the storage container B as illustrated in FIG. 6. Concretely, the RFID tag B1 is pasted, for example, to the side surface of the storage container B. The RFID tag B1 holds identification information about the storage container B to which the RFID tag B1 is pasted. The identification information about the storage container B held by the RFID tag B1 is, for example, information about a name of a product in the storage container.

In the wafer treatment system 1 including the above components is provided with a controller U as illustrated in FIG. 1. The controller U is composed of a computer including, for example, a CPU, a memory and so on, and includes a program storage (not illustrated). In the program storage, a program for controlling a later-explained wafer treatment in the wafer treatment system 1, and a program for reporting a later-explained propriety of the replaced storage container B are stored. Further, part or all of the controls performed by the controller U may be performed by a PLC (Programmable Logic Controller). Note that the above programs may be the ones recorded in a computer-readable storage medium H and installed from the storage medium H into the controller U. The storage medium may be transitory or non-transitory. Some or all of the programs may be realized by dedicated hardware (circuit board).

<Wafer Treatment>

Next, a wafer treatment performed using the wafer treatment system 1 will be explained.

First, the cassette C housing a plurality of wafers W is mounted on a predetermined cassette stage plate 21 in the cassette station 10. Then, the wafers W in the cassette C are successively taken out by the wafer transfer apparatus 23 and delivered, for example, to the delivery apparatus 52 in the third block G3 in the treatment station 11.

Next, the wafer W is transferred by the wafer transfer apparatus 70 for example, to the lower anti-reflection film forming apparatus 31 in the first block G1, in which a lower anti-reflection film is formed on the wafer W. The wafer W is then transferred by the wafer transfer apparatus 70, for example, to the thermal treatment apparatus 40 in the second block G2, and subjected to a heat treatment.

Next, the wafer W is transferred by the wafer transfer apparatus 70 to the resist coating apparatus 32, in which a resist film is formed on the wafer W. The wafer W is then transferred by the wafer transfer apparatus 70 to the thermal treatment apparatus 40, and subjected to a pre-bake treatment. Note that the same treatment as the thermal treatment after the formation of the lower anti-reflection film is performed also in the pre-bake treatment, and the same treatment is performed also in later-explained thermal treatment after the formation of the anti-reflection film, PEB treatment, and post-bake treatment. However, the thermal treatment apparatuses 40 for the thermal treatments are different from one another.

Next, the wafer W is transferred by the wafer transfer apparatus 70 to the upper anti-reflection film forming apparatus 33, in which an upper anti-reflection film is formed on the wafer W. The wafer W is then transferred to the thermal treatment apparatus 40 and subjected to a heat treatment. The wafer W is then transferred by the wafer transfer apparatus 70 to the edge exposure apparatus 42 and subjected to edge exposure processing.

Next, the wafer W is transferred by the wafer transfer apparatus 70 to the delivery apparatus 52, and transferred by the shuttle transfer apparatus 80 to the delivery apparatus 62 in the fourth block G4. The wafer W is then transferred by the wafer transfer apparatus 100 in the interface station 13 to the exposure apparatus 12 and subjected to exposure processing in a predetermined pattern. Next, the wafer W is transferred by the wafer transfer apparatus 100 to the delivery apparatus 60 in the fourth block G4. The wafer W is then transferred by the wafer transfer apparatus 70 to the thermal treatment apparatus 40 and subjected to a PEB treatment.

Next, the wafer W is transferred by the wafer transfer apparatus 70 to the developing treatment apparatus 30 and subjected to a developing treatment. After the developing treatment, the wafer W is transferred by the wafer transfer apparatus 70 to the thermal treatment apparatus 40 and subjected to a post-bake treatment.

Next, the wafer W is transferred by the wafer transfer apparatus 70 to the delivery apparatus 50 in the third block G3. The wafer W is then transferred by the wafer transfer apparatus 23 in the cassette station 10 to the cassette C on the predetermined cassette stage plate 21, with which a series of the photography process is completed. This series of photography process is executed also for the subsequent wafers W in the same cassette C.

<Accommodating Apparatus>

Figure 7:
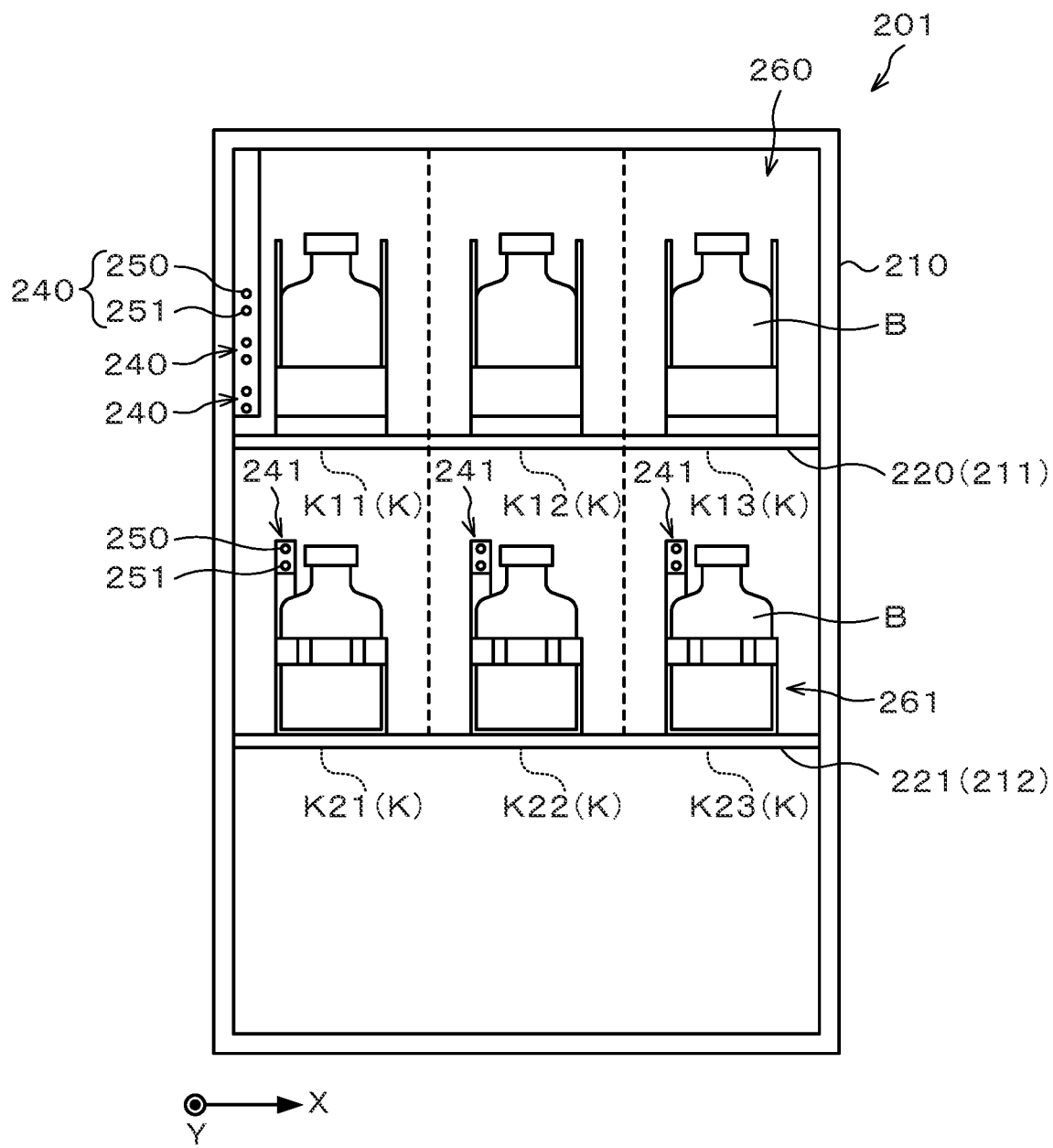
FIG. 7 is a side view illustrating the outline of a configuration of an accommodating apparatus and illustrates a state in which the storage containers are installed.
Figure 8:
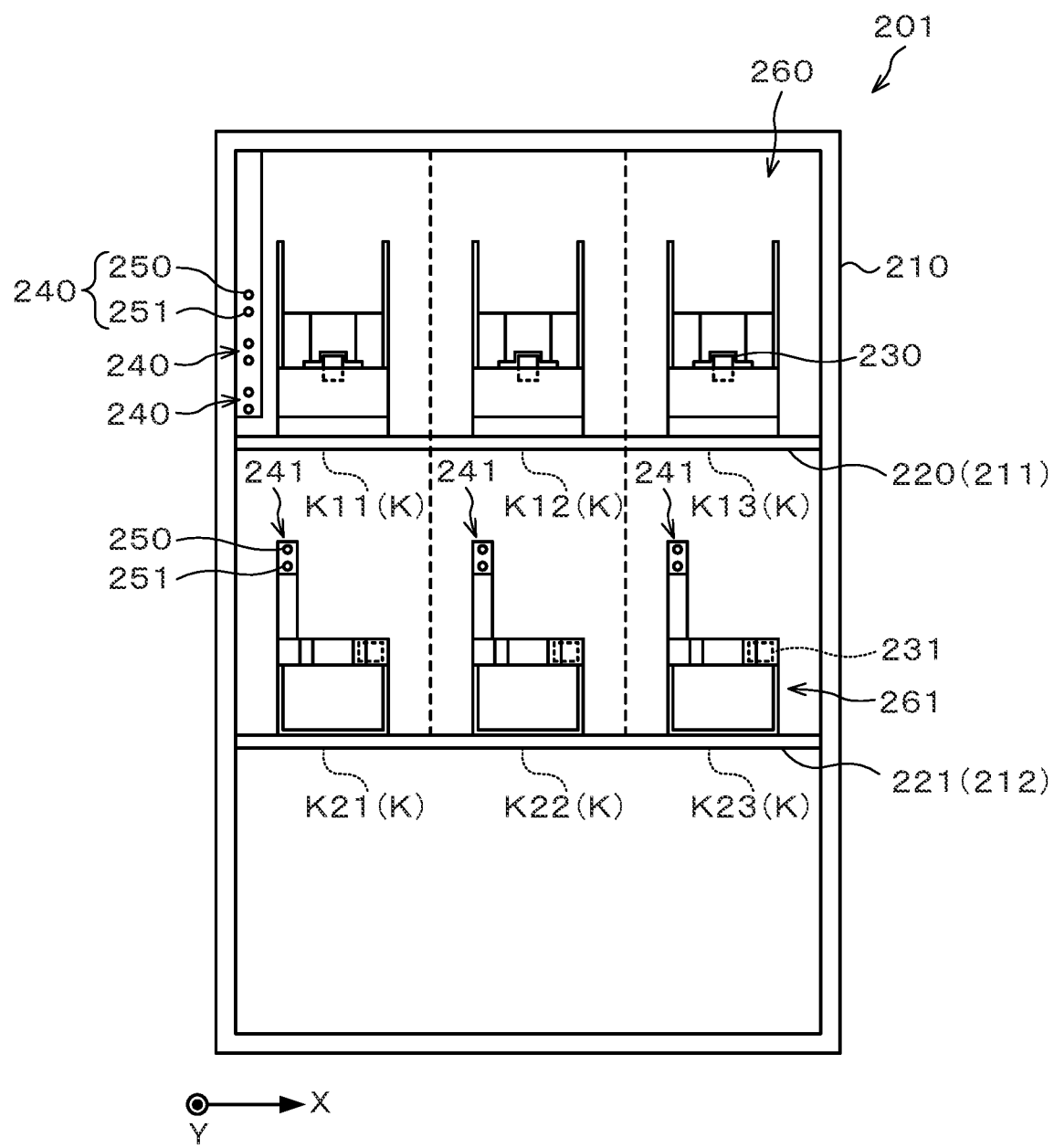
FIG. 8 is a side view illustrating the outline of the configuration of the accommodating apparatus and illustrates a state in which no storage container is installed.
Figure 9:
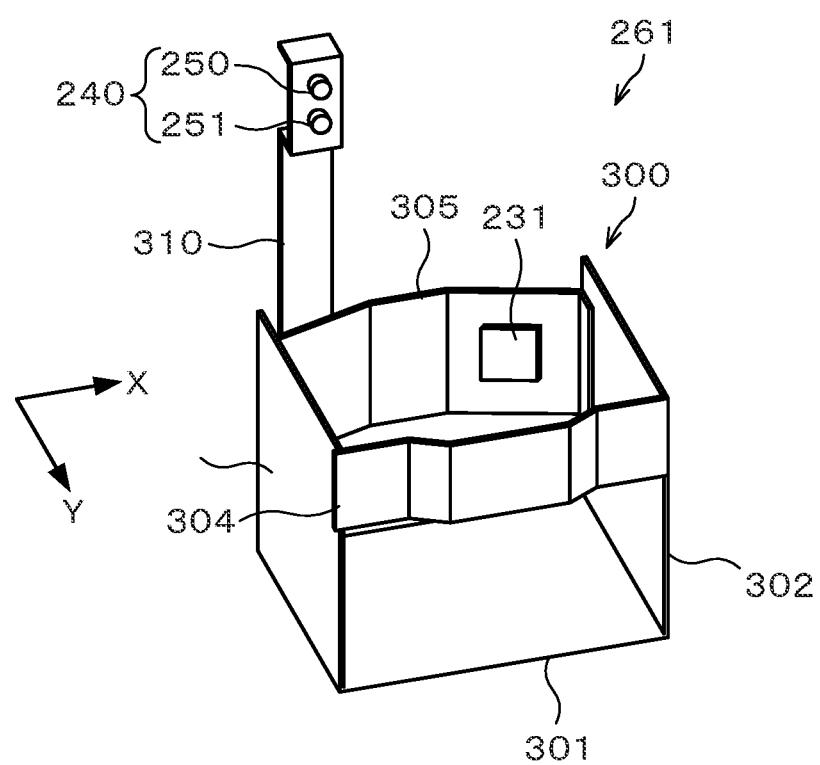
FIG. 9 is a perspective view illustrating the outline of a configuration of a holder provided on a second installation stand.
Figure 10:
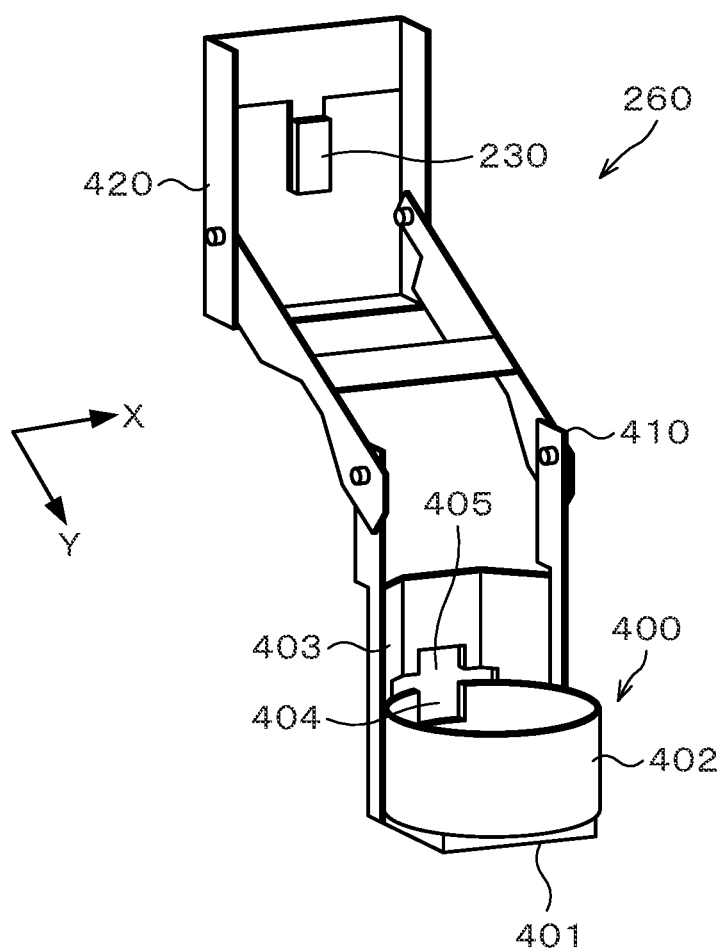
FIG. 10 is a perspective view illustrating the outline of a configuration of a holder provided on a first installation stand.

Subsequently, a configuration of the accommodating apparatus 201 will be explained. FIG. 7 and FIG. 8 are side views illustrating the outline of the configuration of the accommodating apparatus 201, FIG. 7 illustrating a state in which the storage containers B are installed, and FIG. 8 illustrating a state in which no storage container B is installed. FIG. 9 and FIG. 10 are perspective views each illustrating the outline of a configuration of a later-explained holder provided in the accommodating apparatus 201.

As illustrated in FIG. 7 and FIG. 8, the accommodating apparatus 201 includes a shelf 210 as an accommodating part having a plurality of compartments (hereinafter, referred to as "installation compartments") K in which the storage containers B are installed from one side surface side (Y-direction positive side in the drawings).

The shelf 210 has a first installation stand 220 and a second installation stand 221 each having installation compartments K, and the second installation stand 221 is located on the side closer to the bottom than the first installation stand 220, namely, at a place lower than the first installation stand 220. A space in the shelf 210 is partitioned into three parts in the up-down direction by shelf plates 211, 212 and, for example, the shelf plate 211 located on the upper side constitutes the first installation stand 220, and the shelf plate 212 located on the lower side constitutes the second installation stand 221. The height position of the second installation stand 221 is, for example, 80 cm to 105 cm, whereas the height position of the first installation stand 220 is relatively high such as, for example, 140 cm to 165 cm.

Further, each of the first installation stand 220 and the second installation stand 221 has a plurality of (three in the example of the drawings) installation compartments K arranged side by side in the horizontal direction (X-direction in the drawings). In the following, the three installation compartments K on the first installation stand 220 are sometimes referred to as an installation compartment K11, an installation compartment K12, and an installation compartment K13 in order from the X-direction negative side in the drawings, and the three installation compartments K on the second installation stand 221 are sometimes referred to as an installation compartment K21, an installation compartment K22, and an installation compartment K23 in order from the X-direction negative side in the drawings.

The accommodating apparatus 201 further includes RFID readers 230, 231 as acquirers each of which reads (namely, acquires) the identification information about the storage container B from the RFID tag B1 pasted on the side surface of the storage container B. The RF1D reader 230, 231 is provided for each of the installation compartments K and, more specifically, the RFID reader 230 as a first acquirer is provided for each of the installation compartments K on the first installation stand 220, and the RF1D reader 231 as a second acquirer is provided for each of the installation compartments K on the second installation stand 221. The acquisition results by the RFID readers 230, 231 are output to the controller U (see FIG. 1) by at least one of wireless communication and wired communication. Part of all of the communications between the RFID readers 230, 231 and the controller U may be performed via an IO-Link master.

The controller U performs a determination about the installation state of the storage container B in the corresponding installation compartment K for each of the RFID readers 230, 231 based on the acquisition result. The determination performed by the controller U includes the following.

(1) A determination whether the storage container B installed in the corresponding installation compartment K is the one that should be installed in the installation compartment K.
(2) A determination whether the RFID tag of the storage container B is detected.

The determination of the above (1) is performed, for example, referring to a table in which each installation compartment K is associated with the identification information about an appropriate storage container B, stored in advance in the storage (not illustrated) based on the acquisition result by the RFID reader 230, 321. The identification information about the appropriate storage container B is registered in the above table, for example, in a registration mode for the identification information prepared in the wafer treatment system 1. More specifically, when the operator selects the registration mode from the selection screen (not illustrated) displayed on the touch panel and installs the appropriate storage container B in the appropriate installation compartment K, the result read by reading the RFID reader 230 (or the RFID reader 231) corresponding to the installation compartment K is registered in the above table as the identification information about the appropriate storage container B. This registration is performed, for example, when starting the wafer treatment system 1 or when changing a treatment recipe followed by the change of the treatment solution. Further, the above registration may be performed every replacement of the storage container B.

Further, in the accommodating apparatus 201, a report part 240, 241 is also provided for each of the installation compartments K. More specifically, the report part (hereinafter, sometimes referred as a "first report part") 240 is also provided for each of the installation compartments K on the first installation stand 220, and the report part (hereinafter, sometimes referred as a "second report part") 241 is also provided for each of the installation compartments K on the second installation stand 221.

Each of the report parts 240, 241 reports the installation state of the storage container B in the installation compartment K based on the acquisition result by the RFID reader 230, 231 in the corresponding installation compartment K, by a light emitting state of two light-emitting elements 250, 251. The light-emitting elements 250, 251 are, for example LEDs.

The light-emitting elements 250, 251 in the report part 240, 241 are arranged so as to emit light toward the one side surface side (Y-direction positive side in the drawings) being the side where the operator is positioned at the time of the replacement work for the storage container B.

The light-emitting element 250 and the light-emitting element 251 emit light in colors different from each other. For example, the light-emitting element 250 emits light in green and the light-emitting element 251 emits light in red.

The light emission of the light-emitting elements 250, 251 is controlled by the controller U.

In the report part 240, 241, for example, the green light-emitting element 250 is brought into a lighting-on state, for example, when the storage container B installed in the corresponding installation compartment K is the one that should be installed in the installation compartment K, namely, when the storage container B is appropriate, whereas the red light-emitting element 251 is brought into a lighting-on state when the storage container B is inappropriate.

Further, in the report part 240, 241, both of the green light-emitting element 250 and the red light-emitting element 251 are bought into a state of blinking at the same time at a short interval from when the RFID reader 230, 231 provided in the corresponding installation compartment K detects the RFID tag B1 to when the determination of the propriety of the storage container B installed in the corresponding installation compartment K is completed. Thus, the report part 240, 241 reports that it is during the determination.

Further, in the report part 240, 241, both of the light-emitting elements 250, 251 are bought into a state of blinking at the same time at a long interval, for example, when the RFID tag B1 is not detected by the RFID reader 230, 231 provided in the corresponding installation compartment K, namely, when the storage container B is not installed in the corresponding installation compartment K (or when the way to install the storage container B in the corresponding installation compartment K is wrong). Thus, the report part 240, 241 reports that the RFID tag B1 is not detected.

The report part 240, 241 can report also information other than the installation state of the storage container B installed in the corresponding installation compartment K, by the light emitting state of the light-emitting elements 250, 251.

For example, the report part 240, 241 is configured such that when an abnormality occurs in the RFID reader 230, 231, both of the light-emitting elements 250, 251 are brought into a state of alternately blinking at a short interval so as to report the occurrence of the abnormality.

For example, when an abnormality occurs in a device (for example, the IO-Link master) which manages the communication between the report part 240, 241 and the controller U, both of the light-emitting elements 250, 251 of the report part 240, 241 using the device are bought into a state of alternately blinking at a short interval so as to report of the occurrence of the abnormality.

Further, for example, when an abnormality occurs at a control portion of the controller U relating to the treatment solution supply apparatus 200, both of the light-emitting elements 250, 251 of all of the report parts 240, 241 are brought into a lighting-off state so as to report of the occurrence of the abnormality.

As explained above, the report parts 240, 241 can report various kinds of information by the light emitting state of the light-emitting elements 250, 251 which emit light in colors different from each other.

Note that the determination whether an abnormality occurs in the RFID readers 230, 231, the determination whether an abnormality occurs in the device which manages the communication between the report parts 240, 241 and the controller U, and the determination whether an abnormality occurs at the control portion of the controller U relating to the treatment solution supply apparatus 200 are performed by the controller U.

Besides, the height positions of the first report part 240 and the second report part 241 are as follows.

More specifically, the height position of the first report part 240 based on the height position of the first installation stand 220 is lower than the height position of the second report part 241 based on the height position of the second installation stand 221. More specifically, the relative height position of the first report part 240 provided in the installation compartment K based on the position of the storage container B installed in the installation compartment K on the first installation stand 220 is lower than the relative height position of the second report part 241 provided in the installation compartment K based on the position of the storage container B installed in the installation compartment K on the second installation stand 221.

Accordingly, in the case where the height position of the first installation stand 220 is relatively high as explained above, even an operator not tall in stature (for example, an operator having a body height of about an average of Asian female) can visually recognize the light emitting state of the light-emitting elements 250, 251 of the first report part 240 and grasp the installation state of the storage container B in the corresponding installation compartment K.

Further, the first report parts 240 are collectively arranged at the lateral side of the first installation stand 220, whereas the second report part 241 is provided around the corresponding installation compartment K for each of the installation compartments K on the second installation stand 221.

The first report part 240 is provided on the near side (Y-direction positive side in FIG. 7), and the second report part 241 is provided on the far side (Y-direction negative side in FIG.). The reason why the positions in the depth direction (Y-direction in the drawing) of the first report part 240 and the second report part 241 are different can be, for example, the following. Specifically, the reason is that if the second report part 241 provided around the corresponding installation compartment K is provided on the near side (Y-direction positive side in the drawing) for each installation compartment K, wiring or the like for the second report part 241 may hinder the replacement work for the storage container B.

Note that the first report parts 240 are provided, for example, to be arranged one above the other in the up-down direction. The first report part 240 on the upper side corresponds to the installation compartment K11, the first report part 240 at the middle corresponds to the installation compartment K12, and the first report part 240 on the lower side corresponds to the installation compartment K13.

Further, in the accommodating apparatus 201, a holder 260 or a holder 261 is provided for each installation compartment K. The holder 260 provided for the installation compartment K on the first installation stand 220 and the holder 261 provided for the installation compartment K on the second installation stand 221 are different in configuration.

The holder 261 has, an individual accommodating part 300 that individually accommodates the storage container B as illustrated in FIG. 9, and the individual accommodating part 300 is fixed to the second installation stand 221 (see FIG. 7). The individual accommodating part 300 has a bottom plate 301 that supports the bottom surface of the storage container B, side plates 302, 303 that surround the lateral periphery of the storage container B supported on the bottom plate 301, a front plate 304, and a back plate 305.

The RFID reader 231 is provided on the near side (Y-direction positive side in FIG. 9) of the back plate 305 provided on the far side (Y-direction negative side in FIG. 9).

Further, to the back plate 305, a support member 310 supporting the light-emitting elements 250, 251 of the report part 241 is connected.

As with the holder 261, the holder 260 has an individual accommodating part 400 that individually accommodates the storage container B as illustrated in FIG. 10. However, the individual accommodating part 400 is not fixed to the first installation stand 220 (see FIG. 7), but is movable between a supply position being a position on the first installation stand 220 and a replacement position which is the position lower than the first installation stand 220 and where the replacement work for the storage container B is performed. Concretely, the replacement position is a position diagonally downward on the near side (Y-direction positive side in FIG. 10) from the supply position.

To enable the above movement, the holder 260 has a raising and lowering member 410. The raising and lowering member 410 is a member which raises and lowers the individual accommodating part 400 between the supply position and the replacement position. The raising and lowering member 410 is configured, for example, to be foldable, to which the individual accommodating part 400 is fixed at its tip end side and which is pivotally supported on a fixation member 420 at its base end side. When the raising and lowering member 410 is folded, the position of the individual accommodating part 400 is the supply position, and when the raising and lowering member 410 is extended, the position of the individual accommodating part 400 is the replacement position.

The fixation member 420 itself is fixed to the first installation stand 220. Further, the RFID reader 230 is also fixed on the fixation member 420.

When replacing the storage container B held on the holder 260, the operator moves the individual accommodating part 400 from the supply position to the replacement position, and replaces the storage container B in the individual accommodating part 400. After the replacement, the operator returns the individual accommodating part 400 to the supply position.

By configuring the holder 260 with respect to the first installation stand 220 relatively high in height position as explained above, even the operator not tall in stature (for example, the operator having a body height of about an average of Asian female) can easily replace the storage container B on the first installation stand 220.

Note that a lock mechanism for maintaining the position of the individual accommodating part 400 at the supply position or the replacement position, and a lock release mechanism for releasing the lock by the lock mechanism may be provided at the holder 260. Further, a handle may be provided at a lower part of the surface of the like on the near side (Y-direction positive side in FIG. 10) of the individual accommodating part 400 so that the operator can easily move the individual accommodating part 400 between the supply position and the replacement position.

Further, the individual accommodating part 400 has a bottom plate 401 supporting the bottom surface of the storage container B, a cylindrical wall 402 surrounding the lower portion of the storage container B supported on the bottom plate 401, and an upper back plate 403 facing the upper portion on the far side (Y-direction negative side in the drawing) of the storage container B. Further, cutouts 404, 405 are provided at an upper end center of a portion on the far side (Y-direction negative side in the drawing) of the cylindrical wall 402 and at a lower end center of the upper back plate 403, respectively.

The RFID reader 230 fixed to the fixation member 420 fits within the cutouts 404, 405 when the individual accommodating part 400 is located at the supply position. Accordingly, the reading by the RFID reader 230 of the RFID tag B1 pasted on the storage container B accommodated in the individual accommodating part 400 at the supply position is never hindered by the cylindrical wall 402 and the upper back plate 403.

<Mechanism for Supply from the Storage Container B>

Figure 11:
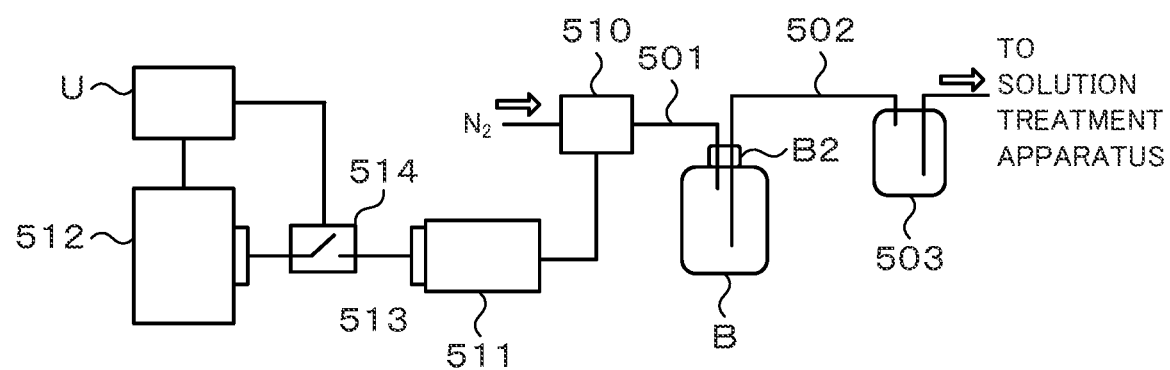
FIG. 11 is an explanatory view illustrating the outline of a configuration of a mechanism for supplying the treatment solution from the storage container installed in the accommodating apparatus.

FIG. 11 is an explanatory view illustrating the outline of a configuration of a mechanism for supplying the treatment solution from the storage container B installed in the accommodating apparatus 201.

The storage container B is installed in the accommodating apparatus 201 (see FIG. 7), and then a cap B2 closing an opening portion at the upper part of the storage container B is attached to the storage container B. The cap B2 is provided with a supply pipe 501 for a pressurizing gas such as a nitrogen gas and a supply pipe 502. for the treatment solution. Once the pressurizing gas is supplied into the storage container B via the supply pipe 501, the treatment solution in the storage container B flows into the supply pipe 502 and is pressure-fed to a buffer tank 503. The treatment solution is supplied from the buffer tank 503 to each solution treatment apparatus of the wafer treatment system 1.

Further, the supply pipe 501 is provided with an opening/closing valve 510 which switches between the supply and the supply stop of the pressurizing gas via the supply pipe 501. The opening/closing valve 510 is provided with a solenoid 511 for executing an opening/closing operation of the supply pipe 501 by the opening/closing valve 510. To the solenoid 511, a control circuit 512 which controls the solenoid 511 is connected via wiring 513.

Further, in this embodiment, a relay 514 which intercepts the communication between the control circuit 512 and the solenoid 511 is provided on the wiring 513. The relay 514 may be provided to be able to intercept the power supply from the control circuit 512 to the solenoid 511. The provision of the relay 514 in this manner enables interlock of disabling the operation of supplying the pressurizing gas to the storage container B, namely, the operation of supplying the treatment solution from the storage container B. In other words, the relay 514 is a mechanism which performs the interlock.

The interlock is enabled, for example, when the storage container B installed in the installation compartment K is not the one that should be installed in the installation compartment K.

Note that the control circuit 512 and the relay 514 operate under the control of the controller U.

<Replacement Method>

Figure 12:
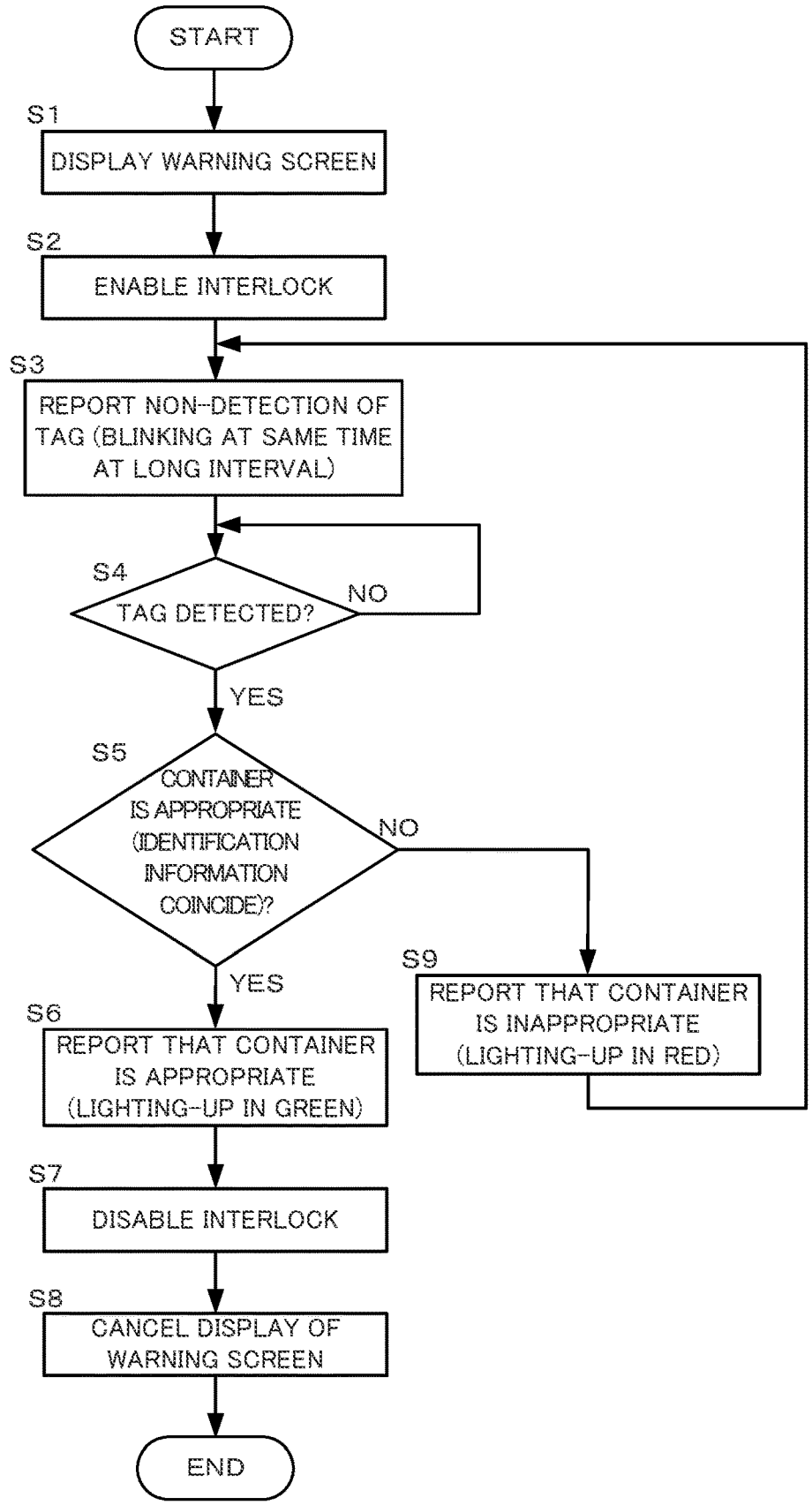
FIG. 12 is a flowchart illustrating the flow of a replacement method for the storage container.

Subsequently, an example of a replacement method for the storage container B including a method of reporting the propriety of the storage container B when the storage container B is replaced will be explained, FIG. 12 is a flowchart illustrating the flow of the replacement method for the storage container B.

Once the controller U determines that the storage container B has become empty, for example, a screen indicating a warning of the fact that the storage container B has become empty is displayed on the touch panel 110 so as to urge the replacement of the storage container B (Step S1). On the screen, for example, the position in the accommodating apparatus 201 of the storage container B that should be replaced, the information about a new storage container B that should be prepared and so on are displayed in addition to the above warning. Note that the following explanation will be made on the assumption that the storage container B in the installation compartment K11 has become empty.

Further, whether the storage container B has become empty is determined as follows for instance. Specifically when a liquid level sensor (not illustrated) provided at the buffer tank 503 detects that the amount of the treatment solution in the buffer tank 503 has become small, the supply of the pressurizing gas via the supply pipe 501 to the corresponding storage container B is performed for the replenishment of the treatment solution. If there is no change in the detection result of the liquid level sensor even after a lapse of a predetermined time from the start of the supply of the pressurizing gas, it is determined that the corresponding storage container B has become empty.

Once the storage container B installed in the installation compartment K11 is removed thereafter, the RFID tag B1 is not detected any longer by the RFID reader 230 in the installation compartment K11. Once the RFID tag B1 is not detected any longer, the relay 514 operates to enable the aforementioned interlock (Step S2).

Further, once the RFID tag B1 is not detected any longer by the RFID reader 230 in the installation compartment K11, both of the light-emitting elements 250, 251 of the report part 240 are brought into the state of blinking at the same time at a long interval so as to report the fact from the report part 240 in the installation compartment K11 (Step S3).

When the operator installs the new storage container B in the installation compartment K11, the RFID tag B1 is detected by the RFID reader 230 in the installation compartment K11, and therefore the controller U determines whether the RFID tag B1 is detected by the RFID reader 230 in the installation compartment K11 subsequent to Step S3 (Step S4). This determination is repeated until the RFID tag B1 is detected. More specifically, the determination is repeated until the storage container B after the replacement is installed in the installation compartment K11 and the identification information about the storage container B after the replacement is acquired by the RFID reader 230 provided in the installation compartment K11.

Note that when the readable range of the RFID reader 230 is small, it may be necessary to make the RFID reader 230 face the RFID tag B1 of the new storage container B when installing the new storage container B. In this case, a message of urging the operator to make the RFID reader 230 face the RFID tag B1 of the new storage container B may be displayed on the display screen displayed at Step S1.

When the new storage container B is installed in the installation compartment K11 and the RFID tag B1 is detected by the RFID reader 230 in the installation compartment K11 (Step S4, in the case of YES), the controller U determines whether the storage container B installed in the installation compartment K11 is appropriate (Step S5). More specifically, for example, the controller U determines whether the new storage container B is appropriate, based on the identification information about the new storage container B held in the RFID tag B1 acquired by the RFID reader 230 in the installation compartment K11. More specifically, for example, the controller U determines whether the identification information about the new storage container B held in the RFID tag B1 acquired by the RFID reader 230 in the installation compartment K11 coincides with the identification information about the appropriate storage container B for the installation compartment K11 registered in the aforementioned table. Note that in the determination whether the identification information coincides, the identification information acquired by the RFID reader 230 in the installation compartment K11 is converted to a predetermined character code by the controller U as needed.

The result of the determination at Step S4 is reported by the report part 240 in the installation compartment K11 as explained in the following.

As the result of the determination at Step S5, when the storage container B is appropriate, namely, when the identification information coincides (in the case of YES), only the green light-emitting element 250 of the light-emitting elements 250, 251 of the report part 240 is brought into a lighting-on state so as to report the fact that the storage container B is appropriate, from the report part 240 in the installation compartment K11 (Step S6).

Further, the relay 514 is operated to release (disable) the aforementioned interlock (Step S7).

Then, the display of the screen indicating the warning of the fact that the storage container B in the installation compartment K11 is empty and so on is canceled (Step S8). This cancellation may be performed at the following timing. More specifically, after the release of the interlock, the display of the warning screen at Step S8 may be canceled at the timing when the supply of the pressurizing gas to the storage container B in the installation compartment K11 is restarted, the appropriate treatment solution is supplied from the storage container B, and the corresponding buffer tank 503 is replenished with a predetermined amount of the treatment solution.

In the case where the identification information about the storage container B installed in the installation compartment K 11 does not coincide with the information registered in the aforementioned table and thus the storage container B is inappropriate (in the case of NO) at Step S5, only the red light-emitting element 251 of the light-emitting elements 250, 251 of the report part 240 is brought into a lighting-on state so as to report the fact from the report part 240 in the installation compartment K11 (Step 59).

Thereafter, once the inappropriate storage container B installed in the installation compartment K11 is removed by the operator who has received the report, the RFID tag B1 is not detected any longer by the RFID reader 230 in the installation compartment K11, so that the flow is returned to Step S3 so as to report the fact again.

As explained above, in this embodiment, the treatment solution supply apparatus 200 includes the shelf 210 having a plurality of compartments K in each of which the storage container B is installed from the one side surface side. Further, the treatment solution supply apparatus 200 includes the RFID readers 230, 231 each of which is provided for each of the compartments K and acquires the identification information about the storage container B from the RFID tag B1 of the storage container B installed in the corresponding compartment K. Further, the treatment solution supply apparatus 200 includes the report parts 240, 241 each of which is provided for each of the installation compartments K and reports the installation state of the storage container B in the compartment K based on the acquisition result by the RFID reader 230, 231 for the corresponding compartment K, by the light emitting state of the light-emitting elements 250, 251. Therefore, according to the treatment solution supply apparatus 200, at the time of replacement of the storage container B, the operator during the replacement work can visually recognize the propriety of the replaced storage container B.

Further, in the treatment solution supply apparatus 200, the light-emitting elements 250, 251 of the report parts 240, 241 emit light toward the one side surface side, namely, toward the operator. Therefore, the following effects are offered. As a technique (alternative technique) different from the technique according to this disclosure, there is a conceivable technique of reporting the information reported by the report part 240 in this embodiment by displaying the information on the touch panel 110. The operator needs to move to the touch panel 110 in order to confirm the report content in the above alternative technique, whereas the operator can immediately confirm, in situ without moving, the report contents by the light-emitting elements 250, 251 since the light-emitting elements 250, 251 emit light toward the operator as explained above in this embodiment.

In short, according to the treatment solution supply apparatus 200, it is possible to report, at the time of replacement of the storage container B, the propriety of the replaced storage container B so that the operator during the replacement work can immediately visually recognize the propriety.

In particular, according to this embodiment, the operator can determine, in situ, the propriety of the storage container B installed in the compartment K irrespective of the level of skill of the operator.

Further, in this embodiment, the report parts 240 for the first installation stand 220 are collectively arranged at the lateral side of the first installation stand 220. Therefore, even if the report parts 240 are provided on the near side (Y-direction positive side in FIG. 7 and the like), namely, on the operator side, the replacement work for the storage container B in the installation compartment K on the first installation stand 220 is never hindered by the wiring or the like for the report parts 240. Further, since the report parts 240 are located on the near side, the operator can easily visually recognize the reports by the report parts 240. In particular, in the case where the operator is small in stature, if the report parts 240 for the first installation stand 220 high in height position are located on the far side, there is a possibility that the operator cannot visually recognize the reports by the report parts 240. However, the possibility can be prevented when the report parts 240 are located on the near side.

Further, in this embodiment, the report part 241 for the second installation stand 221 is provided around the corresponding installation compartment K for each installation compartment K. This makes the operator easily grasp the correspondence between the report part 241 and the installation compartment K.

Further, the report part 241 is provided on the far side (Y-direction negative side in FIG. 7 and the like), namely, at a position far from the operator, and thus the replacement work for the storage container B in the installation compartment K on the second installation stand 221 where the report part 241 is provided is never hindered by the wiring or the like for the report part 241. Further, since the second installation stand 221 where the report part 241 is provided is low in height position, even the operator small in stature can visually recognize the report by the report part 241 provided on the far side.

Further, in this embodiment, the report part 240, 241 has a simple configuration composed of the two light-emitting elements 250, 251 which emit light in colors different from each other. By the light emitting state of the two light-emitting elements 250, 251, the report part 240, 241 can report many states relating to the treatment solution supply apparatus 200 including the propriety of the storage container B installed in each partition K. In short, in this embodiment, the report part 240, 241 can report many states relating to the treatment solution supply apparatus 200 with the simple configuration.

Further, in this embodiment, the relay 514 for performing interlock of disabling the operation of supplying the treatment solution from the storage container B is provided, and enables the interlock when the storage container B installed in the installation compartment K is inappropriate. Accordingly, it is possible to prevent the supply of an inappropriate treatment solution. As a result of this, it is possible to prevent the mixture of the appropriate treatment solution with the inappropriate treatment solution in the buffer tank 503 and the occurrence of product defects,

MODIFICATION EXAMPLES

Note that the number of the light-emitting elements included in each of the report parts 240, 241 is not limited to two, but may be one or may be three or more.

In the above example, the information about the name of the product in the storage container B is used for the determination of the propriety of the storage container B installed in the installation compartment K at the time of replacement. In the RFID tag B1, in place of or in addition to the information about the name of the product, other identification information (for example, information about the kind of the treatment solution, the lot number and so on) about the storage container B is held in some cases. In this case, the above other identification information may be used for the determination of the propriety. Further, the above determination of the propriety may be made based on a plurality of pieces of identification information about the storage container B held in the RFID tag B1.

The setting of which identification information about the storage container B held in the RFID tag B1 is used for the determination of the propriety is made, for example, by the operator through the operation of the touch panel 110 while viewing the setting screen displayed on the touch panel 110.

In the above example, the propriety of the storage container B installed in the installation compartment K is reported only by the light emitting state of the report parts 240, 241. In addition to this, the propriety of the storage container B installed in the installation compartment K may be reported by sound via sound output means or voice via voice output means.

Further, in the above example, the warning of the fact that the storage container B has become empty is reported by the screen display via the touch panel 110, but in place of or in addition to this, the warning may be reported by sound via sound output means or voice via voice output means. This can prevent oversight.

The storage container B is provided only in one row in the depth direction (Y-direction in FIG. 7 and the like) in the shelf 210 in the above example, but the storage containers B may be installed in two rows in the depth direction. In this case, the storage container B on the far side (Y-direction negative side in FIG. 7 and the like) is installed from the far side of the shelf 210, and the report parts 240, 241 for the storage container B emit light toward the far side.

Further, the shelf 210 has the two installation stands arranged one above the other in the height direction, such as the first installation stand 220 and the second installation stand 221 in the above example, but may have three or more installation stands arranged one above the other in the height direction. in this case, the installation stand at a position higher than the first installation stand 220 is provided with the RFID reader 230, the report part 240, and the holder 260 as with the first installation stand 220, whereas the installation stand at a position lower than the second installation stand 221 is provided with the RFID reader 231, the report part 241, and the holder 261 as with the second installation stand 221.

The embodiments disclosed herein are examples in all respects and should not be considered to be restrictive. Various omissions, substitutions and changes may be made in the embodiments without departing from the scope and spirit of the attached claims.

According to this disclosure, it is possible to report, at the time of replacement of the storage container for the treatment solution in the treatment solution supply apparatus, the propriety of the replaced storage container so that the operator during the replacement work can immediately visually recognize the propriety.

What is claimed is:

1. A treatment solution supply apparatus for supplying a treatment solution to a substrate treatment apparatus which treats a substrate using the treatment solution, the treatment solution supply apparatus comprising:
   an accommodating part having a plurality of compartments in each of which a storage container storing the treatment solution is installed from one side surface side;
   an acquirer provided for each of the compartments and configured to acquire identification information about the storage container from an identification information holder attached to a side surface of the storage container installed in the compartment corresponding thereto; and
   a report part provided for each of the compartments and configured to report an installation state of the storage container in the compartment based on an acquisition result by the acquirer for the corresponding compartment, by a light emitting state of a light-emitting element,
   the light-emitting element of the report part emitting light toward the one side surface side, wherein:
   the accommodating part has a first installation stand and a second installation stand each having the compartments;
   the acquirer has a first acquirer provided for the first installation stand and a second acquirer provided for the second installation stand;
   the report part has first report parts provided for the first installation stand and second report parts provided for the second installation stand;
   the second installation stand is located at a place lower than the first installation stand;
   a height position of the first report parts based on a height position of the first installation stand is lower than a height position of the second report parts based on a height position of the second installation stand;
   each of the first installation stand and the second installation stand has a plurality of the compartments arranged side by side in a horizontal direction;
   the first report parts are collectively arranged at a lateral side of the first installation stand; and
   the second report parts are arranged around the corresponding compartment in each of the compartments on the second installation stand.

2. The treatment solution supply apparatus according to claim 1, wherein
   the first installation stand comprises:
   an individual accommodating part configured to individually accommodate the storage container; and
   a raising and lowering member configured to raise and lower the individual accommodating part between a position on the first installation stand and a position lower than the first installation stand.

3. The treatment solution supply apparatus according to claim 1, further comprising
   a mechanism configured to perform interlock of disabling an operation of supplying the treatment solution from the storage container installed in the compartment, wherein
   when the storage container after replacement that is installed in the compartment is not a storage container that is to be installed in the compartment, the interlock is enabled.

4. The treatment solution supply apparatus according to claim 1, wherein
   the report part has two light-emitting elements which emit light in colors different from each other.

5. A method of reporting propriety of a storage container for a treatment solution when the storage container is replaced in a treatment solution supply apparatus for supplying the treatment solution to a substrate treatment apparatus which treats a substrate using the treatment solution,
   the treatment solution supply apparatus comprising:
   an accommodating part having a plurality of compartments in each of which the storage container is installed from one side surface side;
   an acquirer provided for each of the compartments and configured to acquire identification information about the storage container from an identification information holder attached to a side surface of the storage container installed in the compartment corresponding thereto; and
   a report part provided for each of the compartments and configured to report information about an installation state of the storage container in the compartment based on an acquisition result by the acquirer for the corresponding compartment, by a light emitting state of a light-emitting element,
   the light-emitting element of the report part emitting light toward the one side surface side,
   the method comprising:
   acquiring the identification information about the storage container by the acquirer provided in the compartment where the storage container after a replacement is installed; determining whether the storage container after the replacement that is installed in the compartment is a storage container that is to be installed in the compartment, based on the acquired identification information; and
   reporting a result of the determination by the report part, wherein:
   the accommodating part has a first installation stand and a second installation stand each having the compartments;
   the acquirer has a first acquirer provided for the first installation stand and a second acquirer provided for the second installation stand;

the report part has first report parts provided for the first installation stand and second report parts provided for the second installation stand;

the second installation stand is located at a place lower than the first installation stand;

a height position of the first report parts based on a height position of the first installation stand is lower than a height position of the second report parts based on a height position of the second installation stand;

each of the first installation stand and the second installation stand has a plurality of the compartments arranged side by side in a horizontal direction;

the first report parts are collectively arranged at a lateral side of the first installation stand; and the second report parts are arranged around the corresponding compartment in each of the compartments on the second installation stand.

6. The method according to claim 5, wherein the first installation stand comprises:

an individual accommodating part configured to individually accommodate the storage container; and a raising and lowering member configured to raise and lower the individual accommodating part between a position on the first installation stand and a position lower than the first installation stand.

7. The method according to claim 5, wherein the treatment solution supply apparatus further comprises a mechanism configured to perform interlock of disabling an operation of supplying the treatment solution from the storage container installed in the compartment, wherein when the storage container after replacement that is installed in the compartment is not a storage container that is to be installed in the compartment, the interlock is enabled.

8. The method according to claim 5, wherein the report part has two light-emitting elements which emit light in colors different from each other.

9. A non-transitory computer-readable storage medium storing a program running on a computer of a controller for controlling a treatment solution supply apparatus for supplying a treatment solution to a substrate treatment apparatus which treats a substrate using the treatment solution, configured to cause the treatment solution supply apparatus to execute a method of reporting propriety of a storage container for the treatment solution when the storage container is replaced in the treatment solution supply apparatus, the treatment solution supply apparatus comprising an accommodating part having a plurality of compartments in each of which the storage container is installed from one side surface side; an acquirer provided for each of the compartments and configured to acquire identification information about the storage container from an identification information holder attached to a side surface of the storage container installed in the compartment corresponding thereto; and a report part provided for each of the compartments and configured to report information about an installation state of the storage container in the compartment based on an acquisition result by the acquirer for the corresponding compartment, by a light emitting state of a light-emitting element, the light-emitting element of the report part emitting light toward the one side surface side, comprising:

acquiring the identification information about the storage container by the acquirer provided in the compartment where the storage container after a replacement is installed;

determining whether the storage container after the replacement that is installed in the compartment is a storage container that is to be installed in the compartment, based on the acquired identification information; and reporting a result of the determination by the report part, wherein:

the accommodating part has a first installation stand and a second installation stand each having the compartments;

the acquirer has a first acquirer provided for the first installation stand and a second acquirer provided for the second installation stand;

the report part has first report parts provided for the first installation stand and second report parts provided for the second installation stand;

the second installation stand is located at a place lower than the first installation stand; a height position of the first report parts based on a height position of the first installation stand is lower than a height position of the second report parts based on a height position of the second installation stand;

each of the first installation stand and the second installation stand has a plurality of the compartments arranged side by side in a horizontal direction;

the first report parts are collectively arranged at a lateral side of the first installation stand; and the second report parts are arranged around the corresponding compartment in each of the compartments on the second installation stand.

10. The non-transitory computer-readable storage medium according to claim 9, wherein the first installation stand comprises:

an individual accommodating part configured to individually accommodate the storage container; and a raising and lowering member configured to raise and lower the individual accommodating part between a position on the first installation stand and a position lower than the first installation stand.

11. The non-transitory computer-readable storage medium according to claim 9, wherein the treatment solution supply apparatus further comprises a mechanism configured to perform interlock of disabling an operation of supplying the treatment solution from the storage container installed in the compartment, wherein when the storage container after replacement that is installed in the compartment is not a storage container that is to be installed in the compartment, the interlock is enabled.

12. The non-transitory computer-readable storage medium according to claim 9, wherein the report part has two light-emitting elements which emit light in colors different from each other.

* * * * *